(12) United States Patent
Seo

(10) Patent No.: US 8,947,072 B2
(45) Date of Patent: Feb. 3, 2015

(54) CONDUCTOR TO WHICH CURRENT DETECTION HEAD IS FIXED, AND CURRENT DETECTION HEAD USED IN MANUFACTURE OF SAME

(75) Inventor: Yusuke Seo, Kasugai (JP)

(73) Assignee: Toyota Jidosha Kabushiki Kaisha, Aichi-ken (JP)

( * ) Notice: Subject to any disclaimer, the term of this patent is extended or adjusted under 35 U.S.C. 154(b) by 388 days.

(21) Appl. No.: 13/505,986

(22) PCT Filed: Aug. 9, 2011

(86) PCT No.: PCT/JP2011/068160
§ 371 (c)(1),
(2), (4) Date: May 3, 2012

(87) PCT Pub. No.: WO2013/021462
PCT Pub. Date: Feb. 14, 2013

(65) Prior Publication Data
US 2013/0063128 A1    Mar. 14, 2013

(51) Int. Cl.
*G01R 31/00*    (2006.01)
*G01R 15/24*    (2006.01)

(52) U.S. Cl.
CPC .......... *G01R 15/243* (2013.01); *G01R 15/246* (2013.01)
USPC ........................................................ 324/96

(58) Field of Classification Search
None
See application file for complete search history.

(56) References Cited

U.S. PATENT DOCUMENTS

| 5,406,532 A * | 4/1995 | Nishikawa ............... 369/13.29 |
| 5,742,157 A | 4/1998 | Ishizuka et al. |
| 2009/0236853 A1 | 9/2009 | Kraemer et al. |

FOREIGN PATENT DOCUMENTS

| DE | 69630186 T2 | 4/2004 |
| DE | 102009003640 A1 | 9/2009 |

(Continued)

OTHER PUBLICATIONS

Makoto Sonehara, et al., "Relation Between Microwave Complex Permeability and Ferromagnetic Fe-Si Layer Thickness in Mn-Ir/Fe-Si Exchange-Coupled Film," IEEE Transactions on Magnetics, Oct. 2006, pp. 2984-2986, vol. 42, No. 10.

(Continued)

*Primary Examiner* — Paresh Patel
(74) *Attorney, Agent, or Firm* — Sughrue Mion, PLLC

(57) ABSTRACT

Provided is a technique for mass-producing a conductor to which is fixed a current detection head that detects the value of current flowing in the conductor, and in which the relationship between the detection value and the current value is stabilized. The head comprises a lens, a magneto-optical element, a conductor, and a fixing member, and the lens, the magneto-optical element, and the conductor are respectively fixed to the fixing member. An optical system is formed using the current detection head such that light is guided through the lens to the magneto-optical element, and light affected by a magneto-optical effect due to the magneto-optical element is guided to the lens. All of the members contributing to current detection are fixed to the fixing member, and therefore the relative positional relationships of all the members contributing to current detection are uniquely determined, enabling conductors with little variation in current detection characteristics to be mass-produced. A shape for determining the positional relationship between the fixing member and the conductor may be formed therebetween in advance, and the positioned current detection head and conductor may be fixed to obtain the conductor.

8 Claims, 8 Drawing Sheets

(56) References Cited

FOREIGN PATENT DOCUMENTS

| | | |
|---|---|---|
| JP | 60-104271 A | 6/1985 |
| JP | 60-202365 A | 10/1985 |
| JP | 63-196865 A | 8/1988 |
| JP | 3-90088 A | 9/1991 |
| JP | 9-145809 A | 6/1997 |
| JP | 2010-181184 A | 8/2010 |

OTHER PUBLICATIONS

Makoto Sonehara, et al., "Preparation and Characterization of Mn-Ir/Fe-Si Exchange-Coupled Multilayer Film With Ru Underlayer for High-Frequency Applications," IEEE Transactions on Magnetics, Oct. 2005, pp. 3511-3513, vol. 41, No. 10.

Keisuke Ogawa, "Optical probe current sensor module using Kerr effect and its application to IGBT switching current measurement," Programme of the 2011 Fifth International Conference on Sensing Technology, Nov. 2011, (on p. 19).

* cited by examiner

CONDUCTOR TO WHICH CURRENT DETECTION HEAD IS FIXED, AND CURRENT DETECTION HEAD USED IN MANUFACTURE OF SAME

CROSS REFERENCE TO RELATED APPLICATION

This application is a National Stage of International Application No. PCT/JP2011/068160 filed Aug. 9, 2011, the contents of all of which are incorporated herein by reference in their entirety.

TECHNICAL FIELD

The present invention relates to a conductor to which is fixed a current detection head which detects the value of current flowing in the conductor. Further, the present invention relates to a current detection head used in the manufacture of a conductor to which a current detection head is fixed.

DESCRIPTION OF RELATED ART

In order to detect the value of current flowing in a conductor, techniques using magneto-optical effects have been developed. Japanese Patent Application Laid-open No. S60-202365 discloses a current detection device wherein a magneto-optical element is fixed to an outer face of a conductor, an incidence optical fiber connects the magneto-optical element and a light source, and an emission optical fiber connects the magneto-optical element and a light-receiving device. In the technique of Japanese Patent Application Laid-open No. 860-202365, the intensity of light guided to the light-receiving device is measured. When current flows in the conductor, a magnetic field acts on the magneto-optical element, and when a magnetic field acts on the magneto-optical element, the Faraday effect acts on light passing through the magneto-optical element, causing rotation of the plane of polarization; when the plane of polarization rotates, the intensity of light received by the light-receiving device changes. The value of current flowing in the conductor determines the magnetic field intensity, the magnetic field intensity determines the rotation angle, and the rotation angle determines the intensity of light received by the light-receiving device, so that in the current detection device of Japanese Patent Application Laid-open No. S60-202365, the value of current flowing in the conductor is detected from the intensity of light measured by the light-receiving device.

Japanese Patent Application Laid-open No. H9-145809 discloses a current detection head provided with an incidence optical fiber, rod lens, total-reflection mirror, polarizer, magneto-optical element, detector, total-reflection mirror, and emission optical fiber. In the technique of Japanese Patent Application Laid-open No. H9-145809, a gap is provided in a core which makes a circuit about a conductor, and the above-described current detection head is installed in this gap. In the technique of Japanese Patent Application Laid-open No. H9-145809, by miniaturizing the current detection head the gap interval is narrowed, the magnetic field intensity occurring in the core is increased, and the current detection sensitivity is raised.

When detecting the value of current flowing in a conductor using the Faraday effect, the Kerr effect, or another magneto-optical phenomenon, the position of the magneto-optical element relative to the conductor, the direction of the magneto-optical element relative to the conductor (for example the direction of the magnetization easy axis of the magneto-optical element relative to the conductor), the positions of the incidence fiber and incidence lens relative to the magneto-optical element, and the positions of the emission fiber and emission lens relative to the magneto-optical element, and similar, greatly affect the relation between detection value and current value. When mass-producing conductors to which current detection heads are fixed, if the aforementioned positional relationships and similar are not stable, there is substantial variation in the detection characteristics (the relation between detection value and current value) among conductors. Conductors with stable detection characteristics cannot be mass-produced.

Japanese Patent Application Laid-open No. S60-202365 explains only that a magneto-optical element is fixed to a conductor and that one end of an incidence optical fiber and one end of an emission fiber are fixed to the magneto-optical element; the importance of the positional relationships explained in the preceding paragraph is not recognized. In Japanese Patent Application Laid-open No. S60-202365, there is no recognition of the problem in which, if for example the positional relationship between the incidence optical fiber and the emission optical fiber shifts, the relation between the intensity of light measured by the light-receiving device and the value of current flowing in the conductor shifts greatly, and no measures to address this are taken.

In Japanese Patent Application Laid-open No. H9-145809, with respect to the optical system from the incidence optical fiber to the emission optical fiber, positional relationships between members are adjusted to desired positional relationships. However, in Japanese Patent Application Laid-open No. H9-145809 the position and direction of the current detection head relative to the conductor are not determined. Japanese Patent Application Laid-open No. H9-145809 does not recognize the problem that, if the position and direction of the magneto-optical element relative to the conductor are not determined, the relation between the intensity of light measured by the light-receiving device and the value of current flowing in the conductor shifts greatly, and no measures to address this are taken.

BRIEF SUMMARY OF INVENTION

This invention provides a technique wherein, when mass producing conductors incorporating current detection heads, mass production of a group of conductors for which there is little variation in the relation between detection value and current value is possible.

The present application relates to a conductor with a current detection head fixed. The current detection head is provided with a lens, a magneto-optical element, and a fixing member; and the lens, the magneto-optical element, and the conductor are respectively fixed to the fixing member. In this state, an optical system is formed such that light is guided through the lens to the magneto-optical element, and light affected by a magneto-optical effect due to the magneto-optical element is guided to the lens.

Here the lens may be demarcated into a lens for incidence and a lens for emission, or the lens may be used for both incidence and emission. The magneto-optical element may be a material in which an optical phenomenon occurs which changes depending on the magnetic field intensity, and may be a material which exhibits the Faraday effect, or may be a material which exhibits the magnetic Kerr effect. The fixing member may comprise an integrated member, or may comprise two or more members which, when combined to form a shape for mutual positioning, ensures a constant mutual positional relationship.

In a conductor of the present application, the lens, magneto-optical element, and conductor are each fixed to the fixing member, and therefore the position of the magneto-optical element relative to the conductor, the direction of the magneto-optical element relative to the conductor (for example, the direction of the easy axis of magnetization relative to the conductor), the position of the incidence lens relative to the magneto-optical element, the position of the emission lens relative to the magneto-optical element, and all other positional relationships significantly affecting detection results, are adjusted to and fixed in constant positional relationships. Conductors with small variation in the relation between detection values and current values can be mass-produced.

If a fixing portion to fix the fixing member to the conductor is formed on the fixing member, and a positioning shape for maintaining a positional relationship between the fixing member and the conductor at a prescribed position is formed therebetween, then by fixing the fixing member on the conductor, conductors can be mass-produced in which the current detection head is fixed in the prescribed position.

One end of an optical fiber may be fixed to the fixing member, with the optical fiber extending from the current detection head. In this case, the task of connecting the current detection head and a light-emitting device, or of connecting the current detection head and a light-receiving device, is simplified. A light guiding path can be secured by the space between a lens and a mirror. A light guiding path formed of a lens and a mirror may be used instead of the optical fiber. An optical fiber is not indispensable.

In a case where the conductor is a conducting plate, it is preferable that the fixing member is fixed to one face of the conducting plate. In this case, it is preferable that an optical system be formed such that the magneto-optical element exhibits the magnetic Kerr effect, and light which has passed through the lens is reflected by the magneto-optical element, and the light affected by the magnetic Kerr effect is returned to the lens. In this case also, a lens for incidence and a lens for emission may be provided separately, or a lens may be used for both incidence and emission.

If an optical system in which reflection occurs at the magneto-optical element is used, by fixing the fixing member to one face of the conducting plate, the positional relationship of the optical system to the conducting plate is adjusted to an intended positional relationship, and a fixed state can be obtained. A conductor group with a stable relationship between detection value and current value can be mass-produced simply.

In a case where a current detection head, to which an optical fiber is extended, is fixed to the conductor, it is preferable that the end portion of the optical fiber be fixed to a base plate. The base plate is disposed in a position facing one face of the conducting plate to which the fixing member is fixed. If a penetrating hole is formed in the base plate, the end portion of an optical fiber can be inserted into the penetrating hole and fixed. Further, a light source and a light-receiving device can be disposed on the base plate. Hence the positional relationship of the optical fiber and light source is adjusted, and the positional relationship of the optical fiber and light-receiving device is adjusted by, the base plate. The base plate can be used to dispose the light source to cause polarized light to be incident on the end portion of the optical fiber for incidence and the light-receiving device which outputs an electrical signal corresponding to the rotation angle of polarized light emitted from the end portion of the optical fiber for emission. The light-receiving device may be a device which outputs an electrical signal corresponding to the rotation angle occurring due to the magnetic Kerr effect, or may be a device which detects the intensity of the polarized light after the polarized light is affected by the magnetic Kerr effect and passes through a polarizing filter, or may be a device which detects the intensity ratio or intensity difference of polarization components in two orthogonal directions.

The fixing member may be configured from an integrated member, or the fixing member may be configured by combining a first fixing member and a second fixing member. In this case, positioning shapes to ensure a constant mutual positional relationship when the two are combined are formed on both the first fixing member and the second fixing member.

In a case where a first fixing member and second fixing member are combined to configure a fixing member, the optical fiber and lens may be fixed to the first fixing member and the magneto-optical element and conductor may be fixed to the second fixing member, or the optical fiber may be fixed to the first fixing member and the lens, magneto-optical element, and conductor may be fixed to the second fixing member.

Using the above-described configuration, manufacture of a first fixing member to which are fixed the "optical fiber and lens" or the "optical fiber", and of a second fixing member to which are fixed the "lens, magneto-optical element and conductor" or the "magneto-optical element and conductor", is facilitated, and manufacture of the fixing member is facilitated.

If a shape for adjusting a positional relationship between the conductor and the second fixing member at a prescribed position is formed in advance on the second fixing member, by fixing the second fixing member to the conductor, conductors in which the current detection head is fixed at a prescribed position can be mass-produced.

By using an optical fiber, a light guiding path can be secured simply. In this case, an optical fiber for incidence and an optical fiber for emission may be prepared separately, or an optical fiber may be used for both directions. Further, a single optical fiber provided with a first core through which light toward the magneto-optical element passes, and a second core through which light from the magneto-optical element passes may be used. In the latter case, only a single optical fiber is needed.

Similarly, a lens through which light toward the magneto-optical element passes and a lens through which light from the magneto-optical element passes may be prepared separately, or a lens may be used for both directions.

DETAILED DESCRIPTION OF INVENTION

Figure 1:
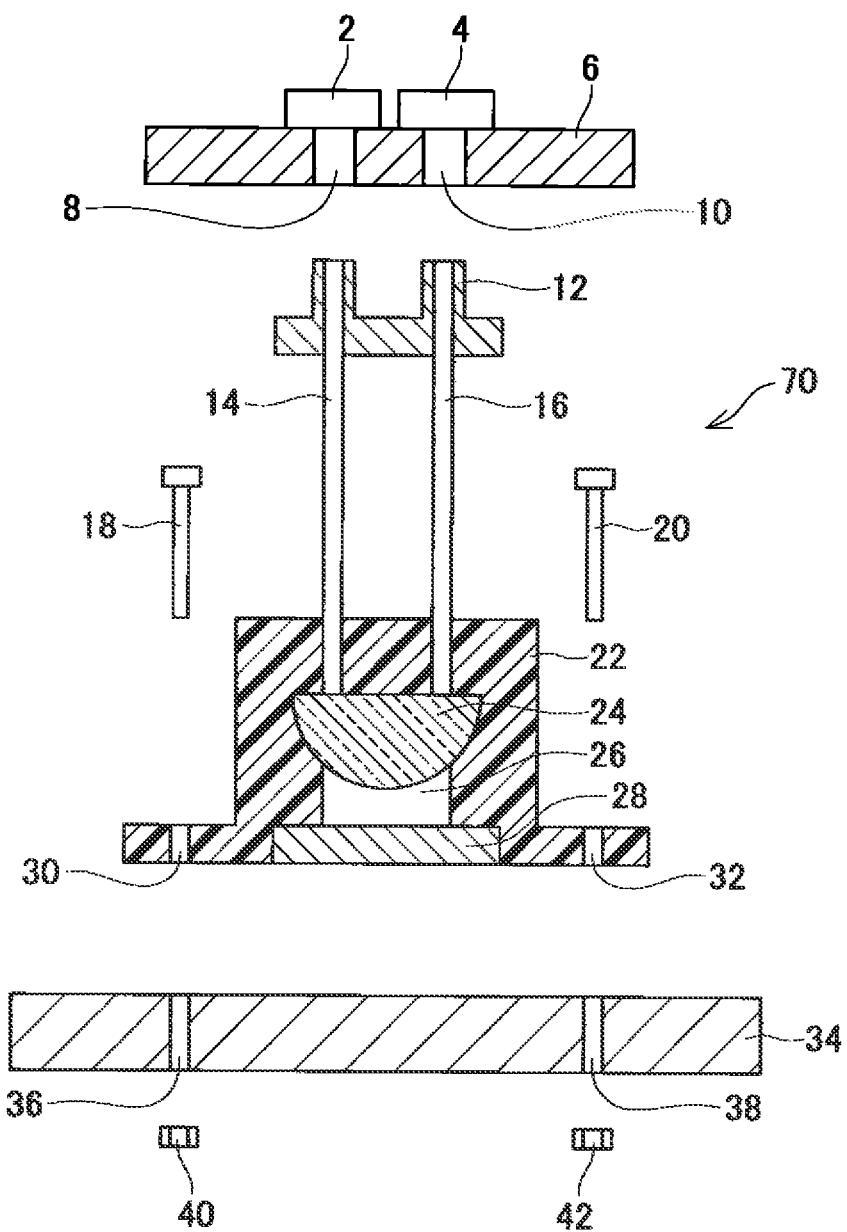
FIG. 1 is an exploded view of a conductor to which is fixed a current detection head in Example 1.

FIG. 1 illustrates the current detection head 70 of a first example. The reference symbol 22 denotes a fixing member, integrally molded using a resin; a magneto-optical element 28, lens 24, the lower end of an incidence optical fiber 14 which guides light to the lens 24, and the lower end of an emission optical fiber 16 which guides light from the lens 24, are fixed to the fixing member 22. Further, mounting holes 30 and 32 are formed at prescribed positions in the fixing member 22, and mounting holes 36 and 38 are also formed at prescribed positions in the conducting plate 34. If a bolt 18 is passed through the mounting holes 30 and 36 and tightened with a nut 40, and a bolt 20 is passed through the mounting holes 32 and 38 and lightened with a nut 42, the fixing member 22 is fixed to the conducting plate 34. Using the mounting hole 30 of the fixing member 22, the mounting hole 36 of the conducting plate 34, and the bolt 18, the position of the mounting hole 30 relative to the conducting plate 34 is fixed, and using the mounting hole 32 of the fixing member 22, the mounting hole 38 of the conducting plate 34 and the bolt 20, the position of the mounting hole 32 relative to the conducting plate 34 is fixed. Because two places of the fixing member 22 are positioned relative to the conducting plate 34, the position and direction of the fixing member 22 are positioned constantly relative to the conducting plate 34. Through use of the mounting holes 30 and 32 in the fixing member 22 and the mounting holes 36 and 38 in the conducting plate 34, the relative positional relationship between the fixing member 22 and the conducting plate 34 is positioned in a constant position. The mounting holes 30 and 32 formed in the fixing member 22 and the flange portion in which the mounting holes 30 and 32 are formed serve as a fixing portion which fixes the fixing member 22 to the conducting plate 34.

Because the lower end of the incidence optical fiber 14, the lens 24, the magneto-optical element 28, the lower end of the emission optical fiber 16, and the conducting plate 34 are all positioned and fixed by the fixing member 22, the relative positional relations between all of the lower end of the incidence optical fiber 14, the lens 24, the magneto-optical element 28, the lower end of the emission optical fiber 16, and the conducting plate 34 are always adjusted to be constant and fixed.

The base plate 6 is disposed in a position facing the conducting plate 34. Penetrating holes 8 and 10 are formed in the base plate 6; the upper end of the incidence optical fiber 14 is inserted into the penetrating hole 8 and fixed, and the upper end of the emission optical fiber 16 is inserted into the penetrating hole 10 and fixed. The reference symbol 12 denotes the fixing member which fixes the upper end of the incidence optical fiber 14 and the upper end of the emission optical fiber 16, and is positioned on the base plate 6. The light source 2, which makes polarized light incident on the upper end of the incidence optical fiber 14, is fixed at the upper portion of the penetrating hole 8. The light-receiving device 4, which receives polarized light emitted from the upper end of the emission optical fiber 16, is fixed at the upper portion of the penetrating hole 10. The light source 2 and light-receiving device 4 are fixed by the base plate 6.

Figure 3:
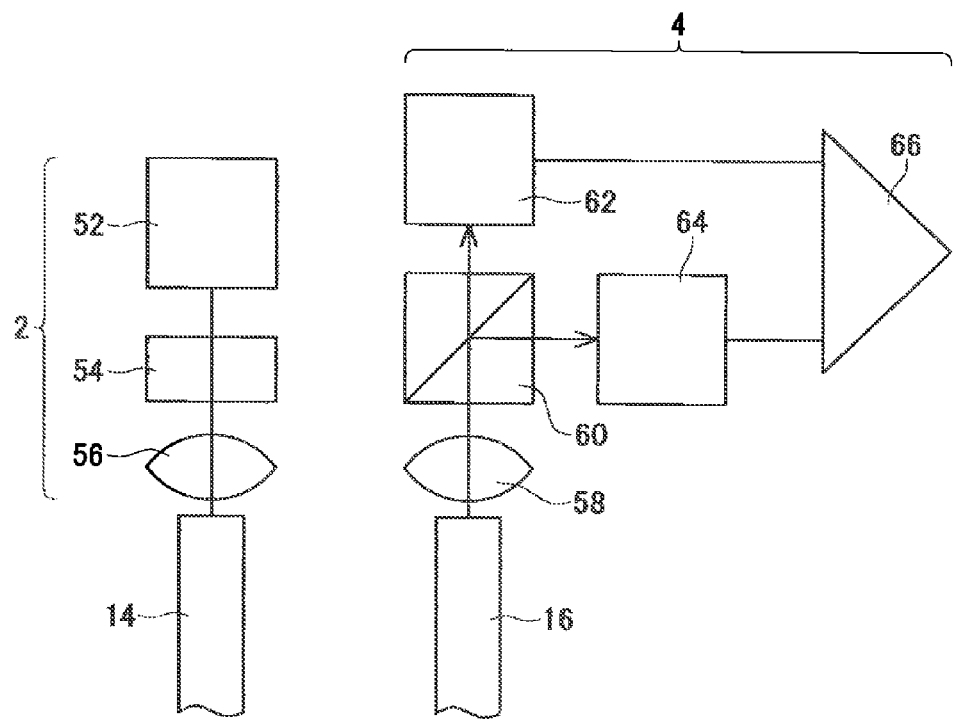
FIG. 3 illustrates the configuration of the light source and light-receiving device connected to the current detection head of FIG. 1.

Details of the light source 2 are illustrated in FIG. 3. The light source 2 comprises a semiconductor laser 52, a polarizing prism 54 and a lens 56; laser light polarized by the polarizing prism 54 is input to the incidence optical fiber 14. The light-receiving device 4 comprises a lens 58, beam splitter 60, first photodiode 62, second photodiode 64, and op-amp 66. The beam splitter 60 is provided with a function to divide light into two depending on the polarization direction, and the polarization plane of light incident on the first photodiode 62 and the polarization plane of light incident on the second photodiode 64 are orthogonal. The value of the difference in the intensity of light with the first plane of polarization and the intensity of light with the second plane of polarization, amplified by the op-amp 66, changes corresponding to the rotation angle of the plane of polarization.

In the structure of FIG. 1, the conducting plate 34 with the current detection head 70 fixed is mass-produced. Optical fibers 14 and 16 extend from the current detection head 70. The upper ends of these optical fibers 14 and 16 are fixed to the base plate 6. The optical fiber 14 connects the light source 2 and magneto-optical element 28, and the optical fiber 16 connects the magneto-optical element 28 and the light-receiving device 4, to complete the current detection device.

Figure 2:
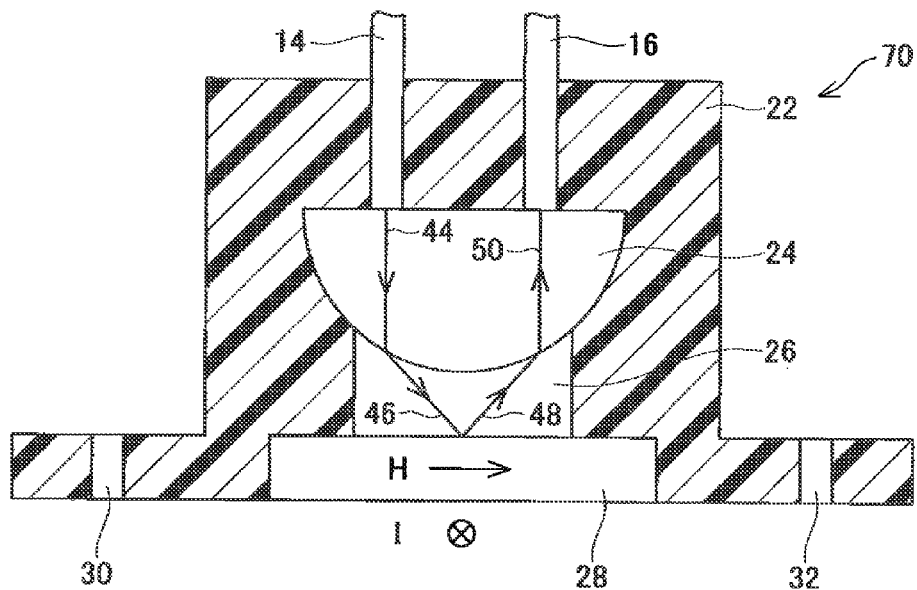
FIG. 2 is an enlarged view of the current detection head of FIG. 1.

Action of the current detection device of FIG. 1 is explained. The semiconductor laser 52 emits laser light. This laser light passes through the polarizing prism 54, and consequently only a light component polarized in a specific plane of polarization passes through the lens 56 and is incident on the optical fiber 14. As illustrated in FIG. 2, the optical path of the polarized light reaching the lower end of the optical fiber 14 is changed to an oblique direction by the lens 24, and the polarized light reaches the upper face of the magneto-optical element 28. Having reached the upper face of the magneto-optical element 28, the polarized light is reflected by the upper face of the magneto-optical element 28.

The conducting plate of FIG. 1 is long in the direction perpendicular to the plane of the paper, and current I flows in a direction perpendicular to the plane of the paper. FIG. 1 corresponds to a cross-sectional view along line A-A in FIG. 4. Hence the magnetic field H in the left-right direction in FIG. 1 and FIG. 2 acts on the magneto-optical element 28. When polarized light is reflected by the upper face of the magneto-optical element 28 on which the magnetic field H is acting, a magnetic Kerr effect (in this case, the longitudinal Kerr effect) occurs. A crystal which exhibits the magnetic Kerr effect is selected for the magneto-optical element 28. Because the magnetic Kerr effect occurs, the plane of polarization of the polarized light reflected by the upper face of the magneto-optical element 28 rotates. That is, the plane of polarization of the incident light 46 is not the same as the plane of polarization of the reflected light 48, and rotation occurs. Reference 44 in FIG. 2 indicates the incident light within the lens 24, and reference 50 in FIG. 2 indicates the reflected light within the lens 24.

Light reflected by the upper face of the magneto-optical element 28 passes through the lens 24, emission optical fiber 16, lens 58, and beam splitter 60, and is incident on the first photodiode 62 and second photodiode 64. The amplitude value of the difference in the intensity of light with a first polarization plane detected by the first photodiode 62 and the intensity of light with a second polarization plane (orthogonal to the first polarization plane) detected by the second photodiode 64 changes depending on the rotation angle of the polarization plane occurring due to the magnetic Kerr effect. From the output of the op-amp 66, the angle of rotation of the polarization plane occurring due to the magnetic Kerr effect, the intensity of the magnetic field H acting on the magneto-optical element 28 which caused the rotation angle, and the magnitude of the current I which caused the magnetic field intensity, are detected.

When mass-producing the conducting plate 34 with a current detection head 70 of FIG. 1 to FIG. 3, in order to mass-produce the conducting plate 34 with a stabilized relation between detection value and current value, it is important that the relative positional relationships and the relative directional relationships between members contributing to current detection be adjusted and fixed in constant relations.

Figure 4:
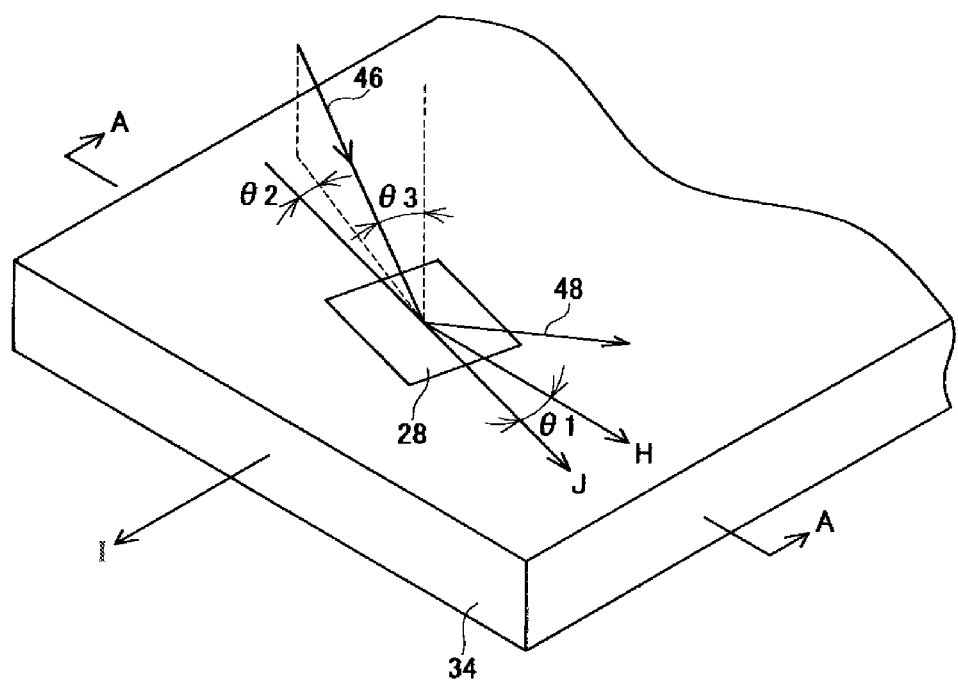
FIG. 4 explains the positional relationship and directional relationship between a conductor, magneto-optical element and light path.

As illustrated in FIG. 4, the intensity of the magnetic field H occurring when a current I is flowing in the conducting plate 34 changes with the position relative to the conducting plate 34. Hence the relative positional relationship between the conducting plate 34 and the magneto-optical element 28 is important. The magneto-optical element 28 is provided with an easy magnetization axis J. The angle of rotation of the polarization plane occurring due to the magnetic Kerr effect is also affected by the angle θ1 made by the easy magnetization axis J and the magnetic field H. Hence the angle θ1 made by the easy magnetization axis J of the magneto-optical element 28 and the conducting plate 34 is also important. The angle of rotation of the polarization plane occurring due to the magnetic Kerr effect is also affected by the angles made by the easy magnetization axis J and the incident light 46 (the horizontal-direction angle θ2 and the perpendicular-direction angle θ3). The relative positional relationships between the optical fiber 14, the lens 24, the magneto-optical element 28, and the optical fiber 16 are important.

In the current detection device of FIG. 1 to FIG. 3, the optical fiber 14, lens 24, magneto-optical element 28, optical fiber 16, and conducting plate 34 are respectively fixed to the fixing member 22, so that the relative positional relationships and relative directional relationships of the optical fiber 14, lens 24, magneto-optical element 28, optical fiber 16, and conducting plate 34 are adjusted in constant relationships and fixed. In this example, all of the members 14, 24, 28, 16 and 34 contributing to current detection are fixed to the fixing member 22, so that the relative positional relationships and relative directional relationships (angular relationships) of all of the members 14, 24, 28, 16 and 34 contributing to current detection are adjusted in constant relationships and fixed. By using the current detection device of FIG. 1 to FIG. 3, conducting plates 34 with current detection heads 70 with a stabilized relation between detection value and current value can be mass-produced.

Further, using the base plate 6 the relative positional relationships and relative angular relationships between the upper end of the optical fiber 14, the semiconductor laser 52, the polarizing prism 54, and the lens 56 are adjusted in constant relationships and fixed. Moreover, using the base plate 6, the relative positional relationships and relative angular relationships of the upper end of the optical fiber 16, lens 58, beam splitter 60, first photodiode 62, and second photodiode 64 are adjusted in constant relationships and fixed. These elements also contribute to mass production of conducting plates 34 with current detection devices in which the relation between detection value and current value is stabilized.

Figure 5:
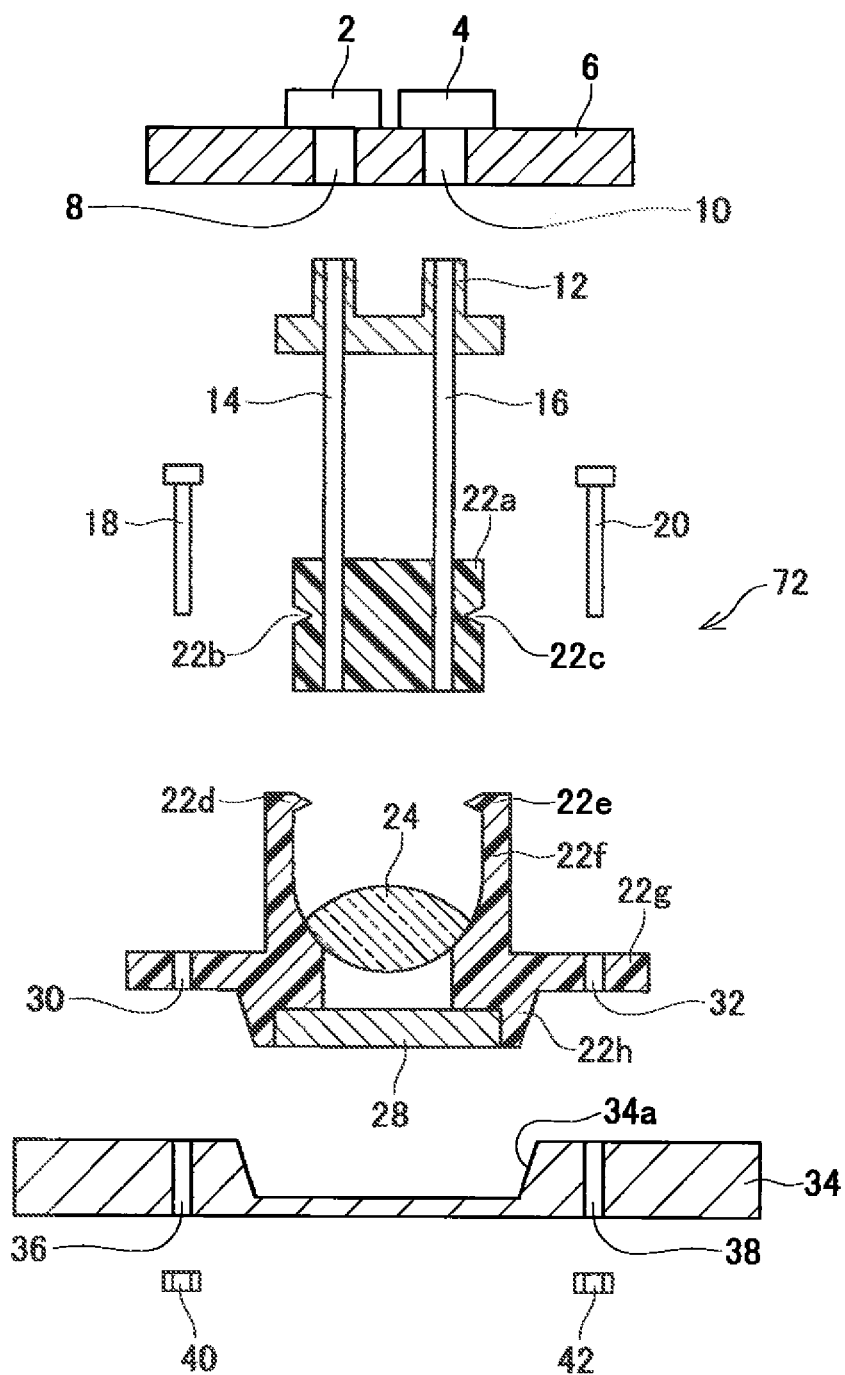
FIG. 5 is an exploded view of a conductor to which is fixed a current detection head in Example 2.

The fixing member 22 may be formed as a single physical object, as illustrated in FIG. 1, or may be formed using two physical objects, as illustrated in FIG. 5. In the case of FIG. 5, an example is illustrated in which the optical fibers 14 and 16 are fixed to a first fixing member 22*a*, and the lens 24 and magneto-optical element 28 are fixed to a second fixing member 22*f*. A pair of concavities 22*b* and 22*e* is formed in the first fixing member 22*a*, and a pair of engaging claws 22*d* and 22*e* is formed on the second fixing member 22*f*. When the first fixing member 22*a* and the second fixing member 22*f* are combined, in a state in which the engaging claw 22*d* meshes with the concavity 22*b* and the engaging claw 22*e* meshes with the concavity 22*c*, the first fixing member 22*a* and second fixing member 22*f* are fixed. In this state, the relative positional relationship of the first fixing member 22*a* and second fixing member 22*f* is adjusted in a constant relationship and fixed. Upon combining the first fixing member 22*b* and second fixing member 22*f*, the relative positional relationship of the first fixing member 22*a* and second fixing member 22*f* is stabilized, and the relative positional relationships and relative angular relationships of the lower end of the optical fiber 14, lens 24, magneto-optical element 28, and lower end of the optical fiber 16 are adjusted in constant relationships and fixed.

On the second fixing member 22*f* are formed a flange 22*g* for positioning and fixing to the conducting plate 34, and mounting holes 30 and 32. The flange 22*g* and mounting holes 30 and 32 formed on the second fixing member 22*f* serve as a fixing portion to fix the second fixing member 22*f* to the conducting plate 34.

If a bolt 18 is passed through the mounting hole 30 and the mounting hole 36 and is tightened with a nut 40, and a bolt 20 is passed through the mounting hole 32 and the mounting hole 38 and is tightened with a nut 42, then the relative positional relationships and relative angular relationships of the lower end of the optical fiber 14, the lens 24, the magneto-optical element 28, the lower end of the optical fiber 16, and the conducting plate 34 are adjusted in constant relationships and fixed.

In this example, a concavity 34*a* is formed in the conducting plate 34, and the magneto-optical element 28 is accommodated within the range of the thickness of the conducting plate 34. The intensity of the magnetic field acting on the magneto-optical element 28 is increased, and the current detection sensitivity is increased. As illustrated in the examples of FIG. 1 and FIG. 5, the shape of the lens 24 is selected according to the characteristics.

Figure 6:
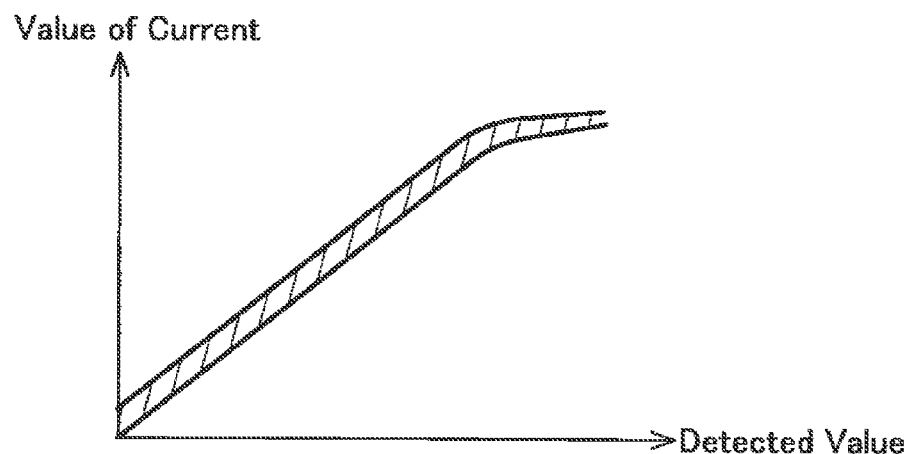
FIG. 6 illustrates the relation between detection value and current value when the current detection head is fixed in Example 2.
Figure 7:
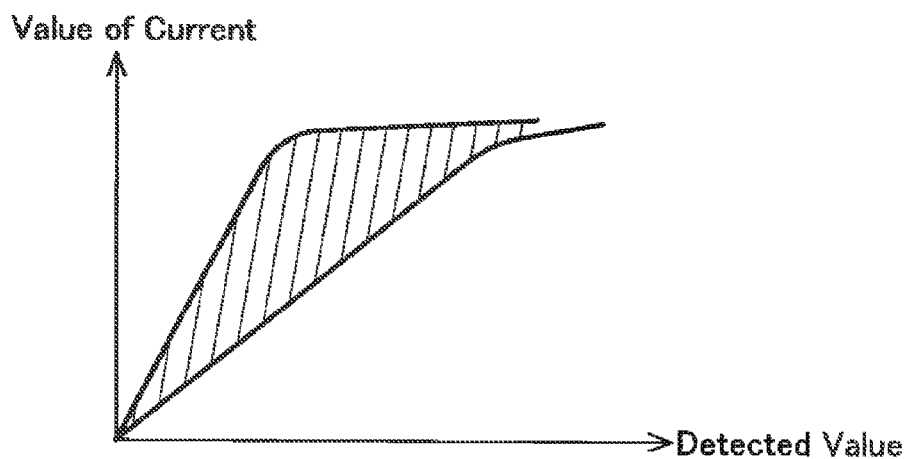
FIG. 7 illustrates the relation between detection value and current value when the current detection head is fixed in the prior art.

FIG. 6 indicates the range of variation in the relation between detection values (the values of the op-amp 66) and true current values when the conducting plate 34 to which the current detection head 72 of FIG. 5 is fixed is mass-produced. The range of variation is small. FIG. 7 indicates the range of variation in the relation between detection values and current values when conducting plates with current detection heads are mass-produced using a method in which a magneto-optical element is fixed to a conducting plate, a lens is positioned relative to the magnetic-optical element, and an optical fiber is positioned relative to the lens. The range of variation is large. When conducting plates with current detection heads are mass-produced using techniques of the prior art, the relation between detection values and current values varies widely among mass-produced items.

Figure 8:
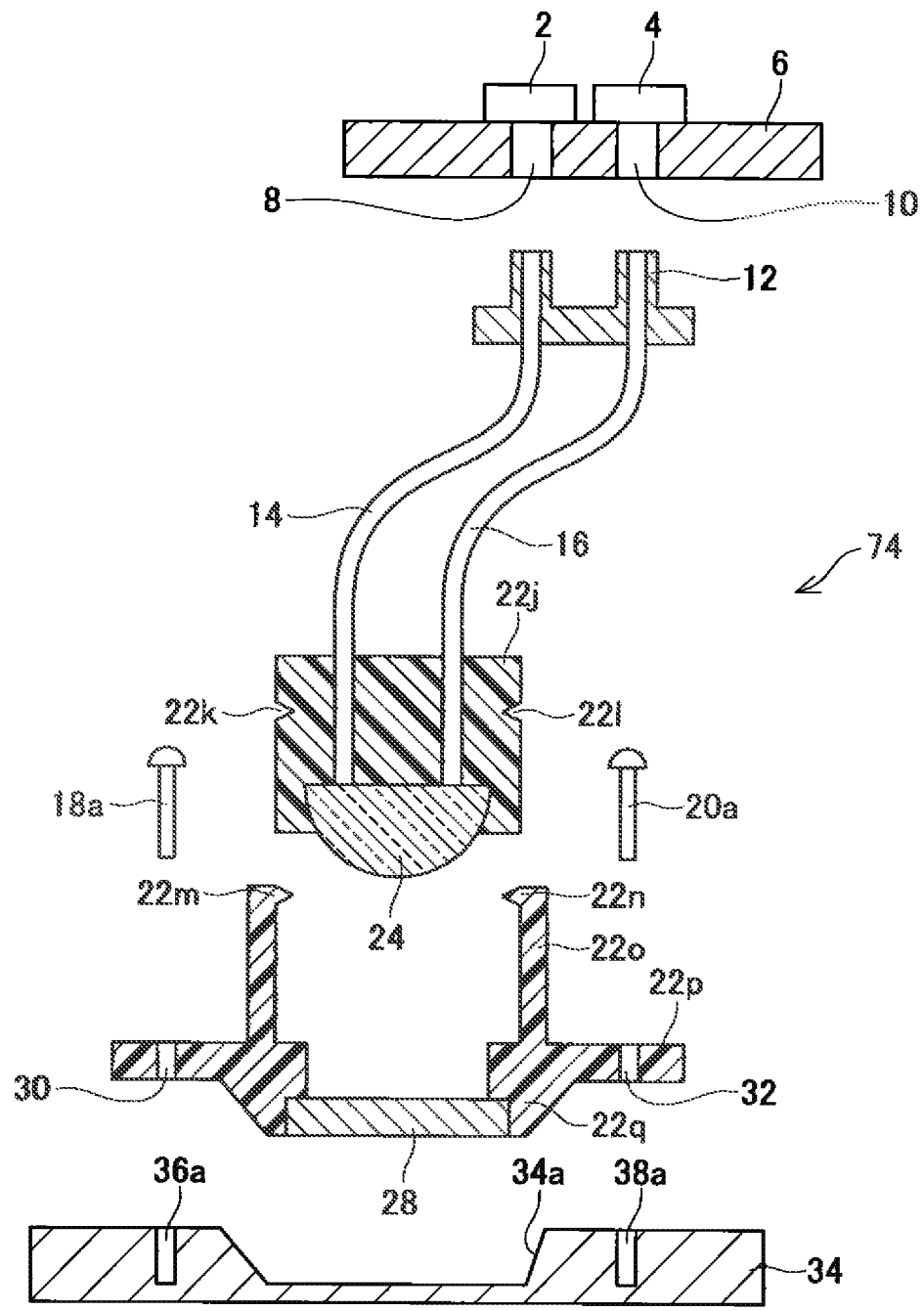
FIG. 8 is an exploded view of a conductor to which is fixed a current detection head in Example 3.

FIG. 8 illustrates a third example. Optical fibers 14 and 16 and a lens 24 are fixed to a first fixing member 22*j*, and a magneto-optical element 28 is fixed to a second fixing member 22*o*. The lens 24 may be fixed to the first fixing member 22*j* as illustrated in FIG. 8, or may be fixed to a second fixing member 22*f* as illustrated in FIG. 5.

Figure 9:
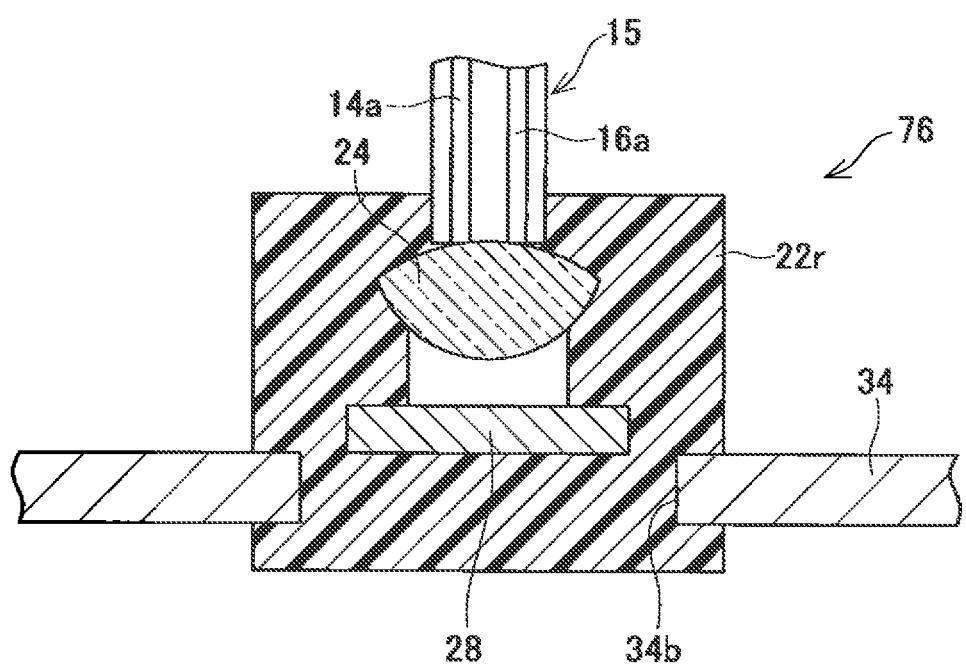
FIG. 9 illustrates a current detection head in Example 4.

FIG. 9 illustrates an example in which a conducting plate 34, magneto-optical element 28, lens 24, and lower end of an optical fiber 15 are insert-molded using a resin material and manufactured. The relative positional relationships of all of the conducting plate 34, magneto-optical element 28, lens 24, and lower end of the optical fiber 15 are fixed in a state of adjustment to be constant by a fixing member 22r. The conducting plate 34 can be mass-produced with a stabilized relationship between detection values and current values. An opening 34b is formed in the conducting plate 34, and there is no separation of the fixing member 22r from the conducting plate 34.

In the case of FIG. 9, a core (first core) 14a which guides light toward the magneto-optical element 28, and a core (second core) 16a which guides light reflected by the magneto-optical element 28, are accommodated within a single optical fiber 15. Because only a single optical fiber 15 is used, connection tasks and similar are simplified.

Figure 10:
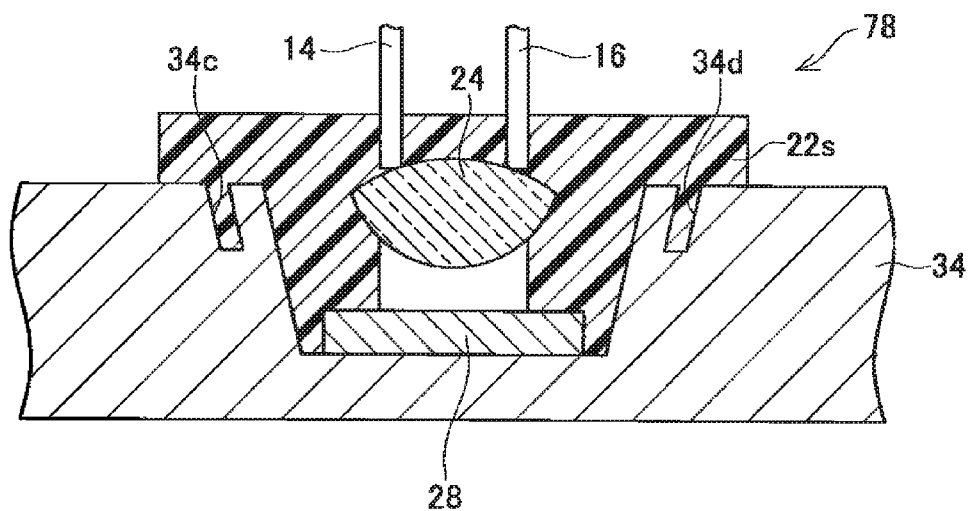
FIG. 10 illustrates a current detection head in Example 5.

FIG. 10 illustrates an example in which a fixing member 22s, magneto-optical element 28, lens 24, lower end of an optical fiber 14, and lower end of an optical fiber 16 are insert-molded using a resin material on one face of the conducting plate 34 and manufactured. If grooves 34c and 34d extending diagonally are formed in the conducting plate 34, there is no separation of the fixing member 22s from the conducting plate 34.

Figure 11:
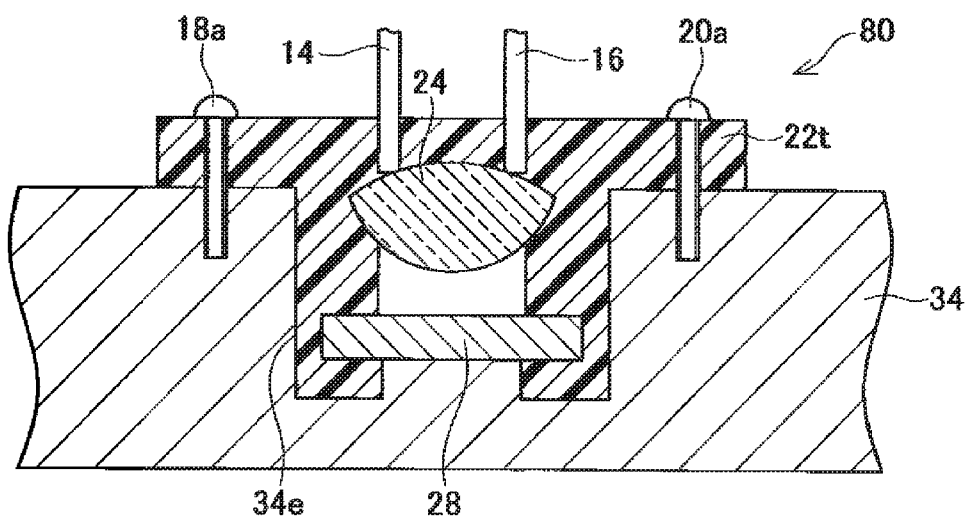
FIG. 11 illustrates a current detection head in Example 6.

FIG. 11 illustrates an example in which a fixing member 22t, manufactured by insert-molding a magneto-optical element 28, lens 24, lower end of an optical fiber 14, and lower end of an optical fiber 16 are insert-molded, is fixed to a conducting plate 34 and manufactured. In this example, the diameter of a hole 34e formed in advance in the conducting plate 34 and the diameter of a cylindrical portion provided in advance in the lower face of the fixing member 22t are managed in a relationship such that the two fit closely. By inserting the cylindrical portion of the fixing member 22t into the hole 34e of the conducting plate 34, the position of the fixing member 22t relative to the conducting plate 34 can be accurately positioned. Further, screws 18a and 20a are used to accurately adjust to a constant angle the mounting angle of the fixing member 22t relative to the conducting plate 34.

In the above, specific examples of the invention have been explained in detail; but the above are merely exemplifications, and do not limit the scope of claims. The technique disclosed in the scope of claims includes various modifications and alterations of the above-presented specific examples. The technical elements explained in the specification or drawings exhibit technical utility whether independently or in various combinations, and are not limited to combinations disclosed in the claims at the time of filing. Further, techniques exemplified in the specification or the drawings can attain a plurality of objects simultaneously, and technical utility is attained by the attainment itself of one among these objects.

What is claimed is:

1. An apparatus of detecting a value of current flowing in a conductor, comprising:
   a current detection head to be fixed to the conductor;
   a base plate; and
   an optical fiber extending between the current detection head and the base plate; wherein,
   one end portion of the optical fiber, a lens, a magneto-optical element are fixed to the current detection head,
   a penetrating hole is formed in the base plate,
   the other end portion of the optical fiber is inserted into the penetrating hole of the base plate and fixed,
   a light source which causes polarized light to be incident on the other end portion of the optical fiber, and a light-receiving device which outputs an electrical signal corresponding to an angle of rotation of the polarized light emitted from the other end portion of the optical fiber, are disposed on the base plate, and
   an optical system is formed within the current detection head such that light from the optical fiber is guided through the lens to the magneto-optical element, and light affected by a magneto-optical effect due to the magneto-optical element is guided to the optical fiber through the lens.

2. The apparatus according to claim 1, wherein the optical fiber comprises:
   a first optical fiber through which light toward the magneto-optical element passes; and
   a second optical fiber through which light from the magneto-optical element passes.

3. The apparatus according to claim 1, wherein,
   the current detection head is fixed to one face of the conductor,
   the magneto-optical element exhibits a magnetic Kerr effect, and
   an optical system is formed such that light which has passed through the lens is reflected by the magneto-optical element and is returned to the lens.

4. The apparatus according to claim 1, wherein the current detection head includes a fixing member to which the one end portion of the optical fiber, the lens, and the magneto-optical element are fixed, and the conductor is to be fixed.

5. The apparatus according to claim 4, wherein the current detection head includes a first fixing member and a second fixing member fixed in a prescribed positional relationship with the first fixing member, the one end portion of the optical fiber and the lens are fixed to the first fixing member, and the magneto-optical element is fixed to the second fixing member.

6. The apparatus according to claim 4, wherein the current detection head includes a first fixing member and a second fixing member fixed in a prescribed positional relationship with the first fixing member, the one end portion of the optical fiber is fixed to the first fixing member, and the lens and the magneto-optical element are fixed to the second fixing member.

7. The apparatus according to claim 1, wherein the optical fiber includes a first core through which light toward the magneto-optical element passes, and a second core through which light from the magneto-optical element passes.

8. The apparatus according to claim 1, wherein light toward the magneto-optical element and light from the magneto-optical element pass through a common lens.

* * * * *